United States Patent  
Downing

(10) Patent No.: US 9,572,218 B2
(45) Date of Patent: Feb. 14, 2017

(54) HIGH-STABILITY LIGHT SOURCE SYSTEM AND METHOD

(71) Applicant: USL Technologies, LLC, Port Townsend, WA (US)

(72) Inventor: John P. Downing, Port Townsend, WA (US)

(73) Assignee: USL Technologies, LLC, Port Townsend, WA (US)

( * ) Notice: Subject to any disclaimer, the term of this patent is extended or adjusted under 35 U.S.C. 154(b) by 0 days.

(21) Appl. No.: 14/546,970

(22) Filed: Nov. 18, 2014

(65) Prior Publication Data

US 2015/0146751 A1 May 28, 2015

Related U.S. Application Data

(60) Provisional application No. 61/906,275, filed on Nov. 19, 2013.

(51) Int. Cl.
*H05B 33/08* (2006.01)
*A62D 3/00* (2006.01)
*H01S 5/0683* (2006.01)
*H01S 5/068* (2006.01)
*G01J 3/10* (2006.01)

(52) U.S. Cl.
CPC .......... *H05B 33/0851* (2013.01); *A62D 3/00* (2013.01); *G01J 3/10* (2013.01); *H01S 5/0683* (2013.01); *H01S 5/06804* (2013.01)

(58) Field of Classification Search
CPC ............ H01S 5/0683; H01S 5/06804; H05B 37/0227; H05B 33/0851; A62D 3/00; G01J 3/10

See application file for complete search history.

(56) References Cited

U.S. PATENT DOCUMENTS

| | | | |
|---|---|---|---|
| 4,841,157 A | 6/1989 | Downing, Jr. | |
| 5,209,112 A | 5/1993 | McCoy et al. | |
| 5,742,418 A * | 4/1998 | Mizutani | H04B 10/532 372/27 |
| 5,796,481 A | 8/1998 | Downing, Jr. | |
| 6,222,202 B1 | 4/2001 | Babic et al. | |
| 6,483,862 B1 | 11/2002 | Aronson et al. | |
| 6,804,273 B1 * | 10/2004 | Sacchetto | H01S 5/0687 372/20 |
| 7,767,947 B2 | 8/2010 | Downing, Jr. | |
| 8,502,452 B2 | 8/2013 | Downing, Jr. et al. | |
| 2008/0093530 A1 | 4/2008 | Hoelen et al. | |
| 2010/0019131 A1 | 1/2010 | Shimizu | |
| 2013/0051413 A1 * | 2/2013 | Chen | H01S 5/02 372/36 |

OTHER PUBLICATIONS

International Search Report and Opinion of the International Searching Authority, mailed Mar. 4, 2016, for corresponding International Application No. PCT/US2015/061391, 5 pages.

* cited by examiner

*Primary Examiner* — Xinning Niu
(74) *Attorney, Agent, or Firm* — Seed IP Law Group LLP

(57) ABSTRACT

A light source system that generates stable optical power over time and temperature in which a feedback control circuit is operative to receive a temperature signal and a sample signal and in response thereto generate a control signal to a driver circuit to maintain a power level of the light output substantially constant over an operative temperature range defined by $T_{min}$ and $T_{max}$.

19 Claims, 9 Drawing Sheets

FIG. 1 "PRIOR ART"

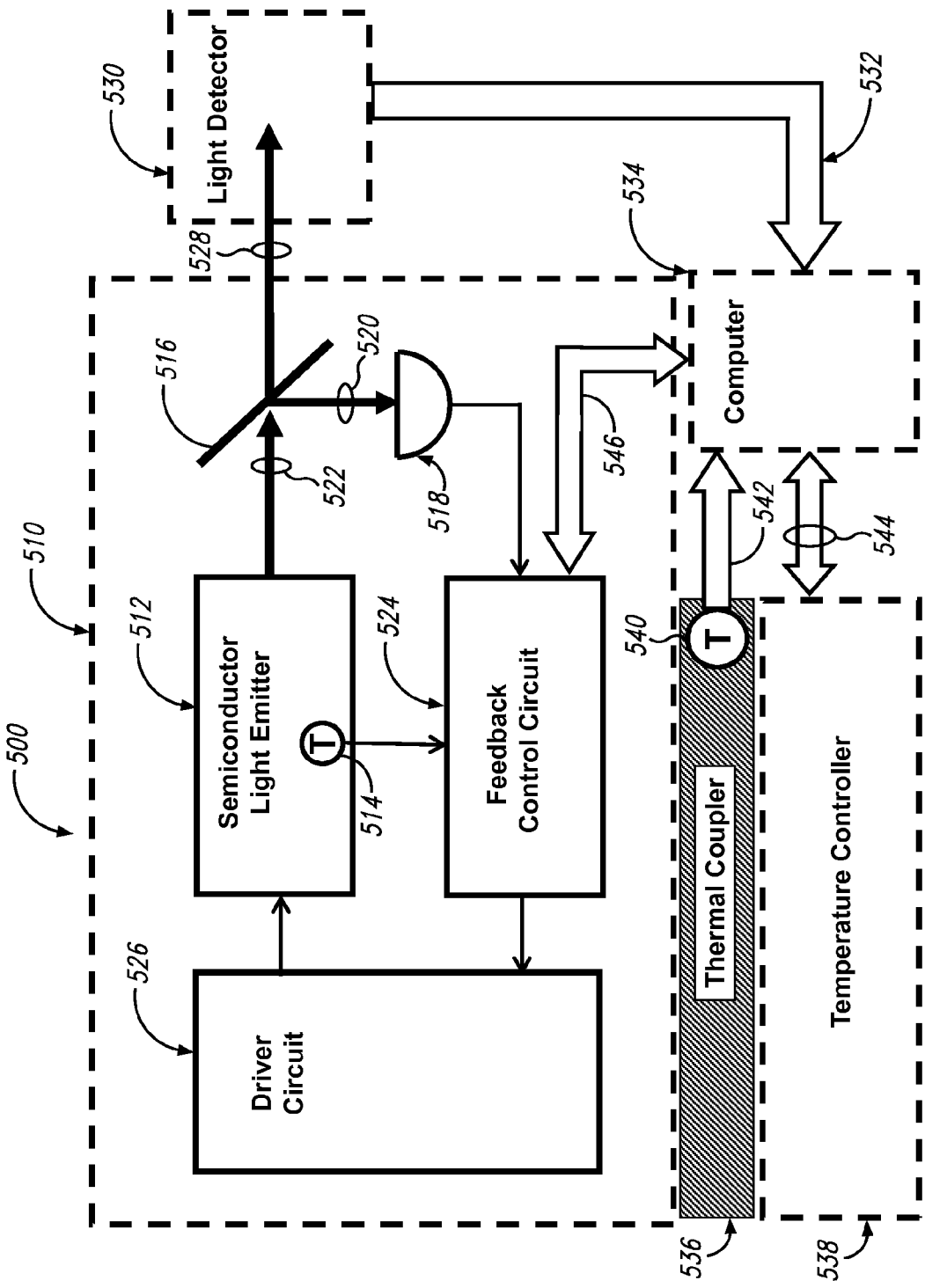

HIGH-STABILITY LIGHT SOURCE SYSTEM AND METHOD

BACKGROUND

Technical Field

The present disclosure pertains to the generation of ultraviolet (UV), visible (VIS), and near-infrared (NIR) light and, more particularly, to a light source system that generates stable optical power over time and temperature.

Description of the Related Art

Constant-power light sources are desired for industrial, medical, and military sensing and measurement applications where the light power ideally remains unchanged for all operating temperatures. An example of industrial sensing wherein accuracy depends on constant light power is the determination of water clarity by optical means. In this application, a water sample is illuminated with a light source and the intensity of light scattered from the illuminated sample is measured with a photodetector. Clear water will scatter relatively little light and turbid water will scatter relatively more of it. An accurate measurement is obtained when the change in scattered light intensity results only from changes in water clarity and not from the intensity of the light source. Because the optical and electrical properties of real light-emitting semiconductors and optical materials vary with temperature, an absolutely stable light source does not exist. Instead, conventional sources compromise performance to achieve acceptable peak wavelength, bandwidth, power, stability, electrical power consumption, size, and cost. When small size, electrical-power consumption, and cost are the primary concerns, semiconductor devices are the light emitters of choice because the semiconductor chips have volumes less than 0.008 $mm^3$ and they can emit conical light beams that can be collimated with simple optics. Laser diodes (LDs) and vertical-cavity surface-emitting lasers (VCSELs) are appropriate when coherent, polarized light is required and resonant-cavity (RCLEDs), edge-emitting light-emitting diodes (EELEDs), and super luminescent diodes (SLDs) are appropriate incoherent light sources. Hereafter, the term laser shall mean an LD or a VCSEL or both and the term incoherent emitter shall mean one or more of the devices comprising RCLEDs, EELEDs, and SLDs. Among the diverse applications of incoherent LED light are pulse oximeters, water turbidity sensors, and optical gyroscopes. Semiconductor lasers provide light for computer pointing devices and telecommunications.

Semiconductor light sources used for communications and industrial applications are driven with commercially available laser and LED drivers that produce power that varies by as much as 15% over 50° C. Improved control can be achieved by placing a temperature sensor near the light emitter and using an electronic circuit to vary the drive current through a semiconductor emitter to maintain nearly constant power. Such a method reduces power fluctuation to less than 2.5% over 50° C. with an open control loop as disclosed in U.S. Pat. No. 4,841,157. An open loop controller relies on inputs other than the output light power itself and cannot respond to deterioration of a semiconductor emitter during its life. Light-source systems having open-loop controllers will therefore drift unpredictably as the light emitter power declines with age, and the host sensing device will require periodic calibration.

In another conventional system having a closed-loop controller, a signal representing a fraction of the emitted light is compared to a preset signal and the light-emitter drive current is continuously adjusted electronically to bring the power to a desired constant value. A closed-loop controller takes a sample of the output, in this case optical power, converts it to an electrical signal, and feeds it back to an input of the light-emitter driver in a feedback loop. It is said to be closed because signals influencing its operation originate within the light-source system, and external environmental factors have negligible effects on it. A schematic of a conventional light-source system with closed-loop electro-optical feedback used for telecommunications and sensing applications is shown in FIG. 1, where wide arrows represent light beams and thin arrows represent electrical signals. The first element is a semiconductor light emitter 100 that is driven with electrical current 102 supplied by a driver circuit 104. The emitted light 106 is collimating by a lens 108 into a beam of parallel light rays 110 having power $P_L$ that impinges upon beamsplitter 112, which reflects a sample 114 of the light beam with power $P_R$ onto monitor photodetector 116 and transmits an output light beam 118 having power $P_O$ to an output device for the intended purpose. The light sample 114 generates a photocurrent 120 that flows through a sense resistor $R_S$ 122, creating sample signal $V_S$ 124. The signal 124 is connected to one input 126 of driver circuit 104 and a reference signal $V_{REF}$ 128 is connected to the other input 130. The driver circuit 104 supplies the light emitter 100 with current 102 so as to maintain the signals $V_S$ and $V_{REF}$ equal and produce constant light power $P_O$. This conventional system compensates for the decline in light power of a semiconductor emitter with temperature and age.

In order to achieve complete stabilization over an operating temperature range, the light emitter 100, beamsplitter 112, monitor photodetector 116, and driver circuit 104 must be maintained at a constant temperature by a thermoelectric cooler (TEC) or by an equivalent means. A beamsplitter is an optical device, such as a glass plate or wedge, that intercepts a light beam and directs a sample of it to a detector where it is converted to an electrical signal for control purposes. A thermoelectric cooler (TEC) is used to stabilize the monitor-photodetector responsivity, the reflectance and transmittance of the optical coating, and the output optical power of a light source. The use of a TEC, however, substantially reduces the wall-plug efficiency of a light source.

This approach is common in nearly all light sources in conventional sensing applications and results in light-power fluctuations less than 5% over 50° C. while compensating for aging effects and alleviating the need for calibration. Examples of such designs are found in U.S. Pat. Nos. 5,209,112; 5,796,481; 6,222,202; and 6,483,862.

In U.S. Pat. No. 7,767,947, Downing describes a light source having a Fresnel plate beamsplitter and a closed-loop controller for stabilizing the power of a VCSEL to vary less than 2.5% over 50° C. The disclosed method compensates for VCSEL aging. In U.S. Pat. No. 8,502,452, Downing and Babic further describe a light source system, hereafter called the optical method, wherein a beam of polarization-locked, laser light impinges on an interference coating deposited on a glass wedge that reflects a sample of the light to a monitor photodetector and transmits a portion to an output device. Photocurrent from the monitor photodetector is input to a closed-loop controller that continuously adjusts the laser drive current such that its power is maintained substantially constant. The interference coating has transverse-electric (TE) and transverse-magnetic (TM) reflectance spectra that have opposite signs and thereby enables the polarization angle of the laser beam to be adjusted at the time of manufacture to minimize the variation of output light power to less than ⅛% over 50° C. A TEC is not required for light sources built by the optical method and as much as a watt of electrical power is conserved thereby substantially improving wall-plug efficiency.

A first manufacturing challenge of the optical method is that the coating reflectance can change as much as 1.8% (18,000 ppm) for a one-degree change of angle of incidence. This sensitivity demands an alignment tolerance of better than ±0.05° to achieve the claimed control accuracy. A second challenge is the spectral tolerance of coating reflectance, which can vary by several percentage points within a batch of beamsplitter coatings. This tolerance substantially reduces production yields and necessitates costly laser-alignment equipment.

Applications including, but not limited to, battery-powered water- and air-turbidity sensing, fog and visibility monitoring, and blood-gas analysis would significantly benefit from miniature devices about the size of a marble or a JEDEC TO-5 package (roughly 1 cm$^3$) that can be powered by two AAA alkaline batteries for at least 50 hours. These requirements preclude the use of thermoelectric coolers (TECs) to stabilize wavelength and power because TECs consume as much as a watt of electrical power. In summary, a state of the art light source with peak wavelength variations less than 20 nm over 50° C. and light source power that can be stabilized to 25 ppm per ° C. exists but only at a high manufacturing cost that substantially limits the market. In sensors and measurement systems that can tolerate changes in wavelength less than about 20 nm in 50° C., the methods disclosed in the present implementation compensate for temperature-dependent control errors. The disclosed implementation achieves equivalent stability with coherent-polarized emitters (lasers) as well as incoherent emitters such as RCLEDs and SLDs but with significant manufacturing-cost reduction. This is achieved by virtually eliminating manufacturing tolerances for the coating, monitor photodiode, spectral characteristics of the semiconductor emitter, and alignment equipment as well as relaxing coating specifications when one is used. The disclosed features broaden the potential market for low-power ultra-stable optically based sensors and systems.

BRIEF SUMMARY

The present disclosure provides a method and system of stabilizing light output from a light source.

In accordance with one aspect of the present disclosure, a light source assembly is provided that includes a semiconductor light emitter structured to emit light, the semiconductor light emitter comprising one from a group containing resonant-cavity light-emitting diodes, single-mode polarization-locked semiconductor lasers, and super luminescent diodes, wherein the light has a peak wavelength and bandwidth in bands in the group comprising ultraviolet-, visible-, and infrared-emission bands; a driver circuit having a first input terminal, a second input terminal structured to receive a reference signal, and an output terminal, the driver circuit operative to supply a drive signal on the output terminal to excite light emissions from the semiconductor light emitter; a lens operative to receive the light and to collimate the light into substantially parallel light rays; a beamsplitter comprising a plate or wedge of optically transparent material having a first surface and a second surface, the beamsplitter positioned to capture and reflect a first portion of the light rays having a first power and transmit a remaining unreflected second portion of the light rays having a second power; a photodetector circuit having a photodetector with an active area and operative to capture substantially all of the reflected first portion of the light rays in the active area and to convert the captured light rays to an electrical sample signal having spatially uniform responsivity over the active area of the photodetector and responsivity that changes less than 0.2% per year; a thermally conductive support member comprised of material having thermal conductivity in excess of 220 W/m·° K, the semiconductor light emitter and the photodetector mounted on the thermally conductive support member to maintain them at substantially the same temperatures; a temperature sensor coupled to the thermally conductive support member and operative to produce a temperature signal representative of the temperature of the semiconductor light emitter and the photodetector; and a feedback control circuit having a first input terminal coupled to the temperature sensor, a second input terminal coupled to the photodetector circuit, and an output terminal coupled to the first terminal of the driver circuit, the feedback control circuit forming a feedback loop between the photodetector circuit and the first input terminal of the driver circuit and operative to provide a control signal on the output terminal to the first input terminal of the driver circuit.

In accordance with another aspect of the present disclosure, the light source assembly driver circuit is structured to adjust the drive signal to excite more or less light emission by the semiconductor light emitter to maintain the power of the second portion of the light rays substantially constant over an operating temperature range defined by $T_{min}$ and $T_{max}$.

In accordance with yet a further aspect of the present disclosure, the photodetector has an operational a characteristic S(T), wherein the responsivity of the photodetector varies with temperature in accordance with $dS/dT = dS/dT + \beta \cdot (dS/d\lambda)$.

In accordance with still yet another aspect of the present disclosure, the feedback control circuit is operative to compute a correction factor responsive to the temperature signal to compensate for a net temperature error and to generate the control signal in proportion to the temperature signal.

In accordance with yet a further aspect of the present disclosure, the feedback control circuit has an analog-to-digital converter coupled to the first input terminal of the feedback control circuit, a microprocessor coupled to the analog-to-digital converter, a nonvolatile memory coupled to the microprocessor, and a digital-to-analog converter coupled to the microprocessor and to the output terminal of the feedback control circuit.

In accordance with another aspect of the present disclosure, the feedback control circuit has a second input terminal, first and second analog-to-digital converters in which each analog-to-digital converter is coupled to a respective input terminal of the feedback control circuit, a microprocessor having two input terminals and an output terminal, each input terminal of the microprocessor coupled to a respective one of the analog-to-digital converters, a nonvolatile memory coupled to the microprocessor, and a digital-to-analog converter coupled between the output terminal of the microprocessor and to the output terminal of the feedback control circuit, the first and second analog-to-digital converters operative to provide simultaneous digitation of the respective temperature and sample signals received on the first and second input terminals of the feedback control circuit.

In accordance with yet another aspect of the present disclosure, a method of calibration is provided that includes the steps of: determining from component test data whether interpolation or numerical solution of a function will be used to minimize a net control error in operation of the light source; providing a characterization of a variation in peak wavelength with temperature in the light source and forward current through a semiconductor light emitter within a production lot; providing a computer programmed to control the calibrating of the feedback control circuit, including providing a temperature signal and a correction factor; providing a program enabling a microprocessor in the feedback control circuit to digitize and store a calibration temperature signal and a correction factor; providing a program enabling the microprocessor in the feedback control circuit to do a numerical iteration to determine an optimal correction factor for each temperature; providing a means for temporarily bonding a thermally conductive support member to a temperature control apparatus capable of controlling the temperature of the light source to an accuracy of 0.1° C. and having a stability of ±0.01° C.; providing a NIST-traceable photodetector or spectrophotometer for monitoring output light power of the light source in absolute units; setting the temperature control apparatus to a reference temperature, either $T_{min}$ or $T_{max}$, and allowing the temperature signal to stabilize; setting the output light power of the light source to an absolute reference level $P_0$; recording the absolute reference level $P_0$ in the computer; signaling the microprocessor to store a first calibration temperature and the corresponding correction factor; setting the temperature-control apparatus to the next calibration temperature and allowing the temperature signal to stabilize; signaling the microprocessor to determine by numerical iteration the value of the correction factor that minimizes a difference between the output optical power and the absolute reference level $P_0$; recording the temperature signal and the correction factor in memory; and setting the temperature-control apparatus to the next calibration temperature and allowing the temperature signal to stabilize.

In accordance with another aspect of the foregoing method, repeating the last four steps until the operating temperature range has been calibrated; sorting calibration data in a table of ascending or descending numerical order, the calibration data comprising temperature signals and corresponding correction factors representing an operating temperature range; performing a regression analysis to develop a function for determining the correction factor from an arbitrary value of the temperature signal and calculate a coefficient of determination $r^2$; and programming the function in the microprocessor for operational calculations if $r^2$ is greater than or equal to 0.9999, otherwise programming the table of temperature signals and corresponding correction factors in the microprocessor as a basis for interpolating correction factors from arbitrary temperature values representing the operating temperature range.

In accordance with a further aspect of the present disclosure, a system is provided that includes a support formed of thermally conductive material; a source of light mounted on the support member; a driver circuit operative to generate a driver signal to the semiconductor light emitter and to receive a reference signal; a device structured to receive the light and to reflect a first portion of the light and to output a second portion of the light; a detector circuit mounted on the support and operative to receive the first portion of the light and generate a sample signal in response to reception of the first portion of light; a temperature sensor disposed on the support and operative to generate a temperature signal; and a feedback control circuit operative to receive the temperature signal and the sample signal and in response thereto to generate a control signal to the driver circuit to maintain a power level of the second portion of light substantially constant over an operative temperature range defined by $T_{min}$ and $T_{max}$.

In accordance with a still yet a further aspect of the present disclosure, a method is provided that includes the steps of receiving a reference signal and a control signal and generating a driver signal in response to receipt of the reference signal and the control signal; generating a beam of light from a light source in response to the driver signal; reflecting a first portion of the beam of light and outputting a second portion of the beam of light; receiving the first portion of the beam of light at a detector circuit and generating a sample signal in response to reception of the first portion of the light; sensing a temperature of the light source and the detector circuit and generating a temperature signal; and receiving the temperature signal and the sample signal in a feedback control circuit and generate the control signal to maintain a power level of the second portion of light substantially constant over an operative temperature range defined by Tmin and Tmax.

BRIEF DESCRIPTION OF THE SEVERAL VIEWS OF THE DRAWINGS

The foregoing and other features and advantages of the present disclosure will be more readily appreciated from the following detailed description when taken in conjunction with the accompanying drawings, wherein:

FIG. 5 shows a functional block diagram of a system having a light source coupled to a temperature controller and a light detector under the control of a computer configured to calibrate a light-source system in accordance with the present disclosure;

DETAILED DESCRIPTION

Figure 1:
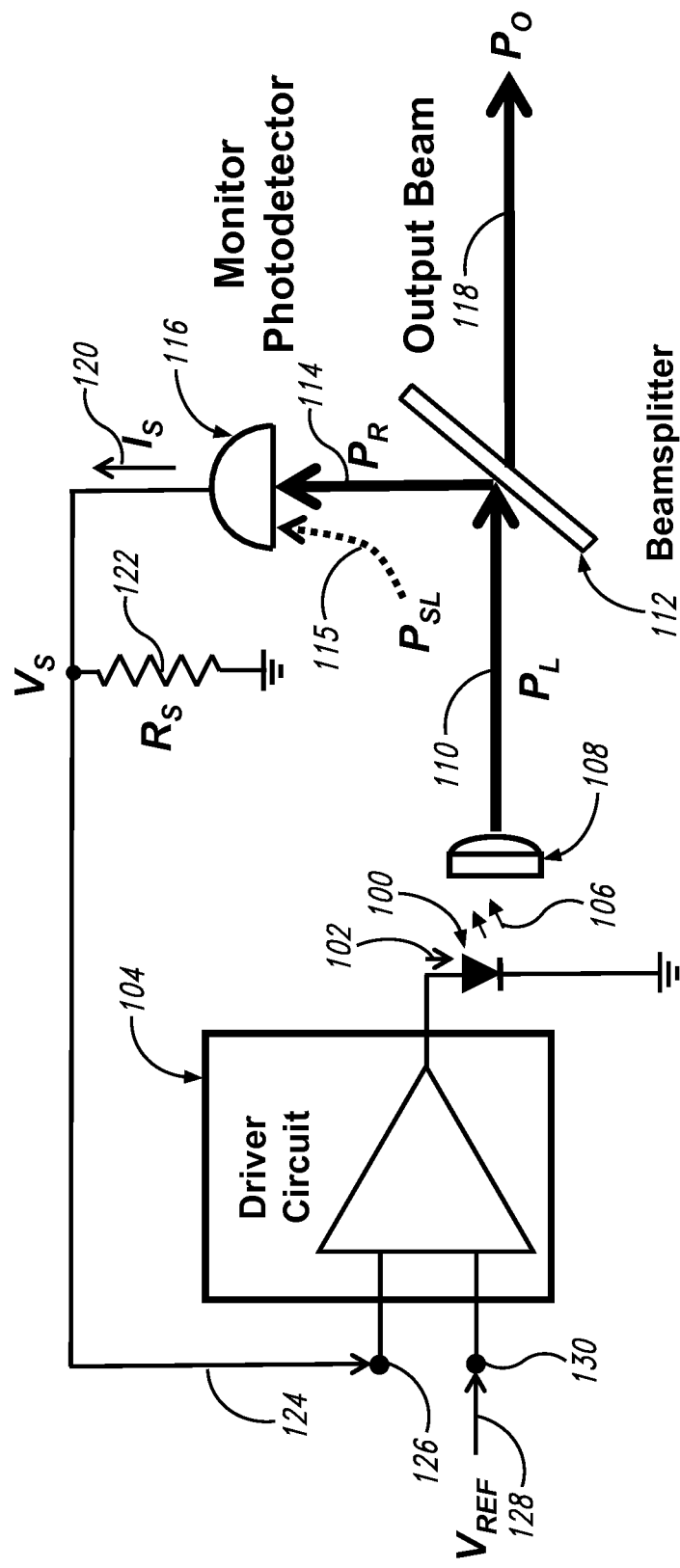
FIG. 1 is a functional block diagram of a conventional closed-loop control apparatus for emitting light of controlled power.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures or components or both associated with semiconductor light sources, including but not limited to light emitting diodes, lenses, glass plates, and mirrors, have not been shown or described in order to avoid unnecessarily obscuring descriptions of the implementations.

Unless the context requires otherwise, throughout the specification and claims which follow, the word "comprise" and variations thereof, such as, "comprises" and "comprising" are to be construed in an open, inclusive sense that is as "including, but not limited to."

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the implementations. The use of the same reference numbers in different instances in the description and the figures indicate similar or identical items, elements, structures, and components common to multiple drawings.

Light-Source System

The departures of the output optical power of a stable light-source system from a set point are called control errors. These errors cause associated inaccuracies in measurements made by sensing devices that incorporate the light source. In this disclosure, the figure of merit for comparing the stability of light-source systems and control errors in the present disclosure is the control error per unit of temperature $\Delta_{max}$. This is defined by equation 1 as the maximum relative power deviation per unit temperature in the operating temperature range.

$$\Delta_{max} = 2 \frac{P(T_{max}) - P(T_{min})}{P(T_{max}) + P(T_{min})} \cdot \frac{1}{T_{max} - T_{min}} [ppm/°C.] \quad (1)$$

Here $P(T_{max})$ and $P(T_{min})$ are the optical power levels of the source at the minimum and maximum operating temperatures. The figure of merit $\Delta_{max}$ is analogous to the temperature coefficient of a voltage source given in parts per million (ppm) per ° C. and is henceforth called the temperature coefficient; it can have either polarity. A reference temperature $T_O$ is defined within the operating temperature range. The reference temperature is preferably $T_{min}$ or $T_{max}$ but can have any value in between. A temperature coefficient of 25 ppm per ° C. is a benchmark stability for the disclosed systems.

The control errors are caused by factors that include but are not limited to: 1) the declining intensity of light emissions with junction temperature approximated by the quantity $\Theta_{TH} \cdot P_E + T_C$, where: $\Theta_{TH}$, $P_E$, and $T_C$ are the thermal resistance, electrical power dissipated in the emitter, and the case temperature, respectively; 2) increases in the wavelength $\lambda$ with temperature expressed in nm per ° C. by coefficient $\beta = d\lambda/dT$; 3) changes in spectral shape of light emissions with temperature, notably the full bandwidth at half maximum power (FWHM) and the distribution of optical power with wavelength; 4) variation of the light beam divergence and power distribution, together called beam quality; divergence is the increase or decrease of beam diameter with distance expressed as an angle; 5) changes in the refractive indices of optical materials and associated variations of reflectances and transmittances of the lenses, beamsplitters, other optical components they comprise; 6) temperature and wavelength dependencies of optical coatings; 7) variation of photodetector responsivity with wavelength and temperature expressed together as: $dS/dT + \beta \cdot (dS/d\lambda)$; and 8) temperature coefficients of the electronic components and the current and voltage biases of amplifiers in the feedback control circuit.

Items 5 and 8 can be ignored as their combined effect on stability is less than 10 ppm per ° C. Table 1 summarizes the temperature effects of concern in the present disclosure. An uncompensated positive error will cause an erroneous decline in optical power and a negative error will cause optical power to erroneously increase. The most significant control error is caused by changes in photodetector responsivity with temperature and wavelength. These factors have magnitudes as large as 2,500 ppm per ° C.

| Error-Causing Factor | Minimum Error | Maximum Error |
|---|---|---|
| Beam Quality ($\eta_R$ and $\eta_X$) | 15 ppm/° C.[1] | 500 ppm/° C.[2] |
| Photodetector $(dS/dT)$[3] | −2500 ppm/° C. | 1250 ppm/° C. |
| Photodetector $(dS/D\lambda)$[4] | 95 ppm/° C. (Si*)[5] | 400 ppm/° C. (InGaAs**)[6] |
| Sense Resistor TCR | −150 ppm/° C. | 150 ppm/° C. |
| AR coating | −840 ppm/° C. | 2,500 ppm/° C. |
| Net Control Error | −3,380 ppm/° C. | 4,800 ppm/° C. |

Notes:
[1]TM-polarized VCSEL beam reflected by an air-glass (H-LAK54) interface;
[2]TE-polarized VCSEL beam reflected by an air-glass (H-LAK54) interface;
[3]values from manufacturer specifications;
[4]wavelengths converted to equivalent temperatures for:
[5]Silicon photodiode and light emitter with $\beta = 0.05$ nm per ° C.; and
[6]InGaAs NIR photodiode and edge-emitting laser diodes with $\beta = 0.35$ nm per ° C.

In general, the reflectance and the coupling efficiency $\eta_R$ are affected by the emitter wavelength and operating temperature. Incoherent light sources have $\beta$ values ranging from 0.03 to 0.15 nm per ° C. and lasers have values ranging from 0.04 to 0.35 nm per ° C. The $\lambda(T)$ curves for lasers can be virtually linear or they can have substantial curvature with superimposed step-like features. The λ(T) curves vary within a production lot of emitters as well as among lots of them. The variations are inconsequential so long as the λ(T) curve does not change over the life of an emitter. As wavelength changes with temperature, so do the properties of optical materials comprising lenses, beamsplitters, and interference coatings used in a light source system. These changes alter the light-reflective and light-transmitting properties of the system.

Referring to FIG. 1, the impingement of spontaneous emissions from the semiconductor chip sides and external light onto the monitor photodiode, together called stray light 115 and indicated by a dashed arrow, will cause random reductions of output power 118 that cannot be compensated by the methods disclosed herein. However, they can be virtually eliminated by packaging techniques well known in the art.

The preferred implementation could include coupling optics but they are not essential and a free-space output is illustrated that has a transmission efficiency $\eta_X$ equal to unity. The reflection coefficient $\eta_R$ will change with temperature as more or less of the beam 110 is reflected onto the monitor photodetector 116, causing the $\eta_R$ to increase or decrease from a reference value. A corresponding decrease or increase in output optical power will occur. The coefficient $\eta_R$ will also change when the power distribution within the beam 110 varies with temperature and causes different areas of the monitor photodetector 116 to be illuminated than at a reference temperature. If the beam 110 impinges areas with greater responsivity, $\eta_R$ will increase and the output optical power will decline and vice versa.

Mathematical Representation of Compensation:

The ability of the disclosed implementation to substantially reduce control errors that are typical of light-source systems such as depicted in FIG. 1 can be appreciated by making sample calculations of output optical power. For a first calculation, assume an incoherent light emitter, preferably a semiconductor light emitter, that emits a collimated light beam 110 having peak emission wavelength 650 nm onto the beamsplitter 112. The beamsplitter 112 is an ordinary microscope slide comprised of BK7 glass inclined at a 45° angle to the light beam so as to give reflectance R=0.094 (9.4%) and transmittance $T_X$=0.906 (90.6%) in accordance with Table 2. Further assume stray light 115 is eliminated by design and signals $V_S$ and $V_{REF}$ are maintained equal by the driver circuit 104, the output optical power of the light source is predicted by equation (2).

$$P_O = FB \cdot (T_X/R) \cdot (\eta_X/\eta_R) \cdot V_{REF}/(S \cdot R_S) \quad (2)$$

The factor FB provides a means for controlling feedback or controlling the reference signal $V_{REF}$ disclosed in the preferred implementations described herein. The responsivity of the monitor photodetector is S expressed in Amps per Watt (A/W). In the present example, FB is uncontrolled by the system and set to 1.000 over the operating temperature range so as to have no effect on the calculation. The terms $T_X$, R, $\eta_X/\eta_R$, and S change with temperature and wavelength as earlier described and sense resistor $R_S$ 122 changes with temperature. Further assuming the following values at a calibration temperature of 20° C.: S=0.4 A/W, $V_{REF}$=0.24 V, $R_S$=2,000 Ohm, and $\eta_X/\eta_R$=1.0, the calculated output power is 2.891 mW. Further assume the temperature coefficient of the monitor photodetector responsivity is 1,000 ppm per °C. and the temperature coefficient of resistance $R_S$ is 250 ppm per °C. Now, raise the operating temperature to 40° C. and maintain the other error-causing factors equal to their values at the calibration temperature (20° C.). At 40° C., the calculated output power is 2.820 mW. It can be appreciated that the combined effects of the temperature coefficients of photodetector sensitivity (1,000 ppm per °C.) and sense resistance (250 ppm per °C.) result in a 2.46% reduction of output optical power.

The disclosed implementation is capable of varying feedback or varying the reference signal $V_{REF}$ continuously in a closed-loop controller, represented by factor FB in equation (2) over the operating temperature range so as to compensate for the temperature sensitivity of the terms in equation (2). A second exemplary calculation illustrates how this works. Starting with the initial condition at 20° C. with factor FB=1.00, the output power is again 2.891 mW. The system temperature is then raised to 40° C. with all terms retaining their prior values, except FB. The feedback factor FB is now changed from its initial value of 1.00 in the prior calculation to 1.0245. The calculated output power is 2.891 mW and is virtually unchanged from its initial value.

The present disclosure accomplishes the improved control in one of two ways. In the first way, a control circuit is introduced in the feedback loop of the known system depicted in FIG. 1 to vary the amount of feedback in the operating temperature range and cancel changes in output optical power that would otherwise occur. This can be done by analog methods such as by adding an error signal to the signal $V_S$ or by digital methods wherein the digitized $V_S$ signal is multiplied by a factor such as illustrated by the exemplary calculations.

Figure 3A:
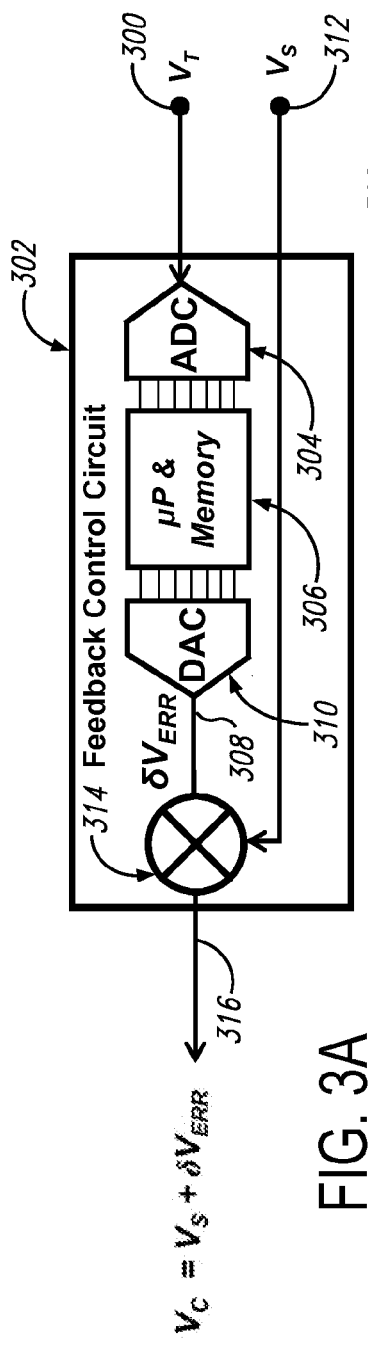
FIG. 3A shows a variation in the control loop circuitry wherein signal $V_S$ is added to an error signal $\delta V_{ERR}$ at a summing junction to produce a control signal $V_C$.
Figure 3B:
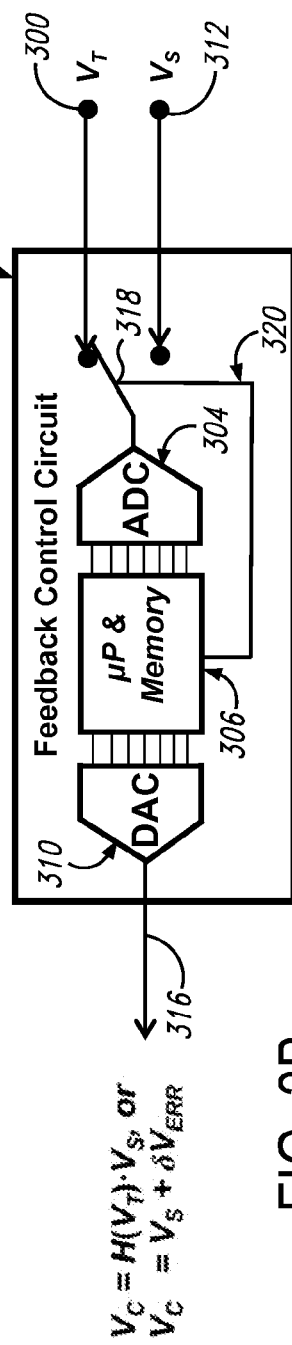
FIG. 3B shows a variation in the control loop circuitry wherein an analog switch multiplexes the inputs $V_T$ and $V_S$ to an ADC.
Figure 3C:
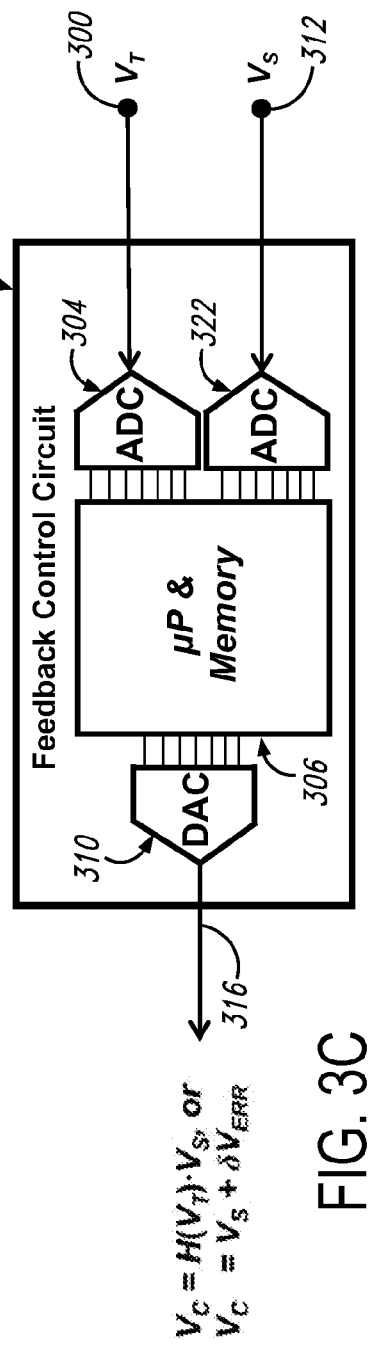
FIG. 3C shows a variation in the control loop circuitry wherein signals $V_T$ and $V_S$ are digitized simultaneously by ADCs and the values used to compute a control signal $V_C$.
Figure 3D:
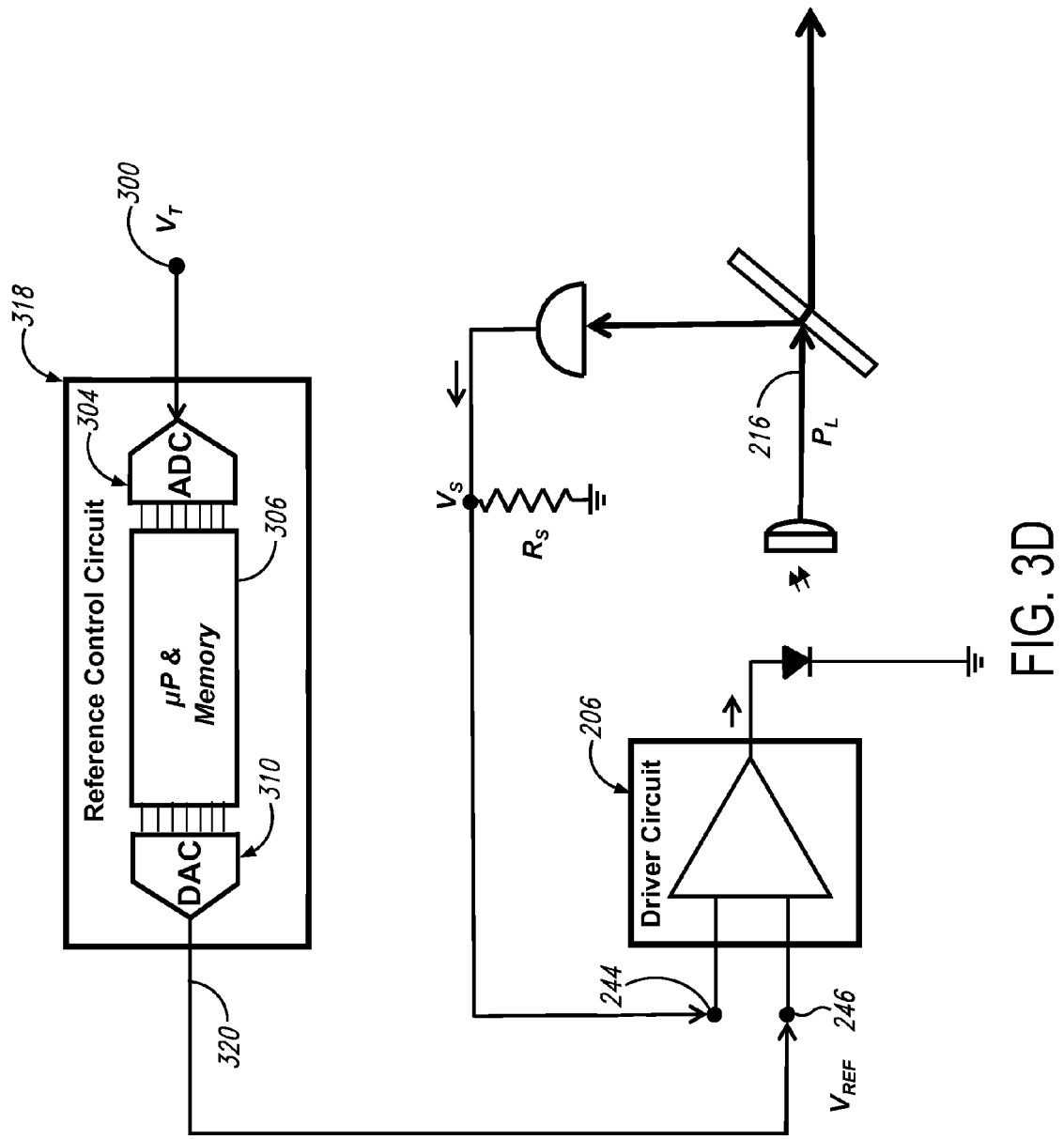
FIG. 3D illustrates a circuit for generating a reference signal to the driver circuit.

In a second way, the sample signal $V_S$ is connected to one input of the driver circuit, as shown in FIG. 3D, and the output of a reference-signal control circuit is connected to a second driver-circuit input. The signals at the inputs to the driver circuit are maintained equal with feedback. The input to the reference-signal control circuit is a signal $V_T$ that represents the temperature of the semiconductor light emitter. As the temperature of the semiconductor light emitter changes, the reference-signal control circuit alters the signal $V_{REF}$ to compensate for the temperature change and maintain constant output optical power. Systems for doing this are described next.

Figure 2:
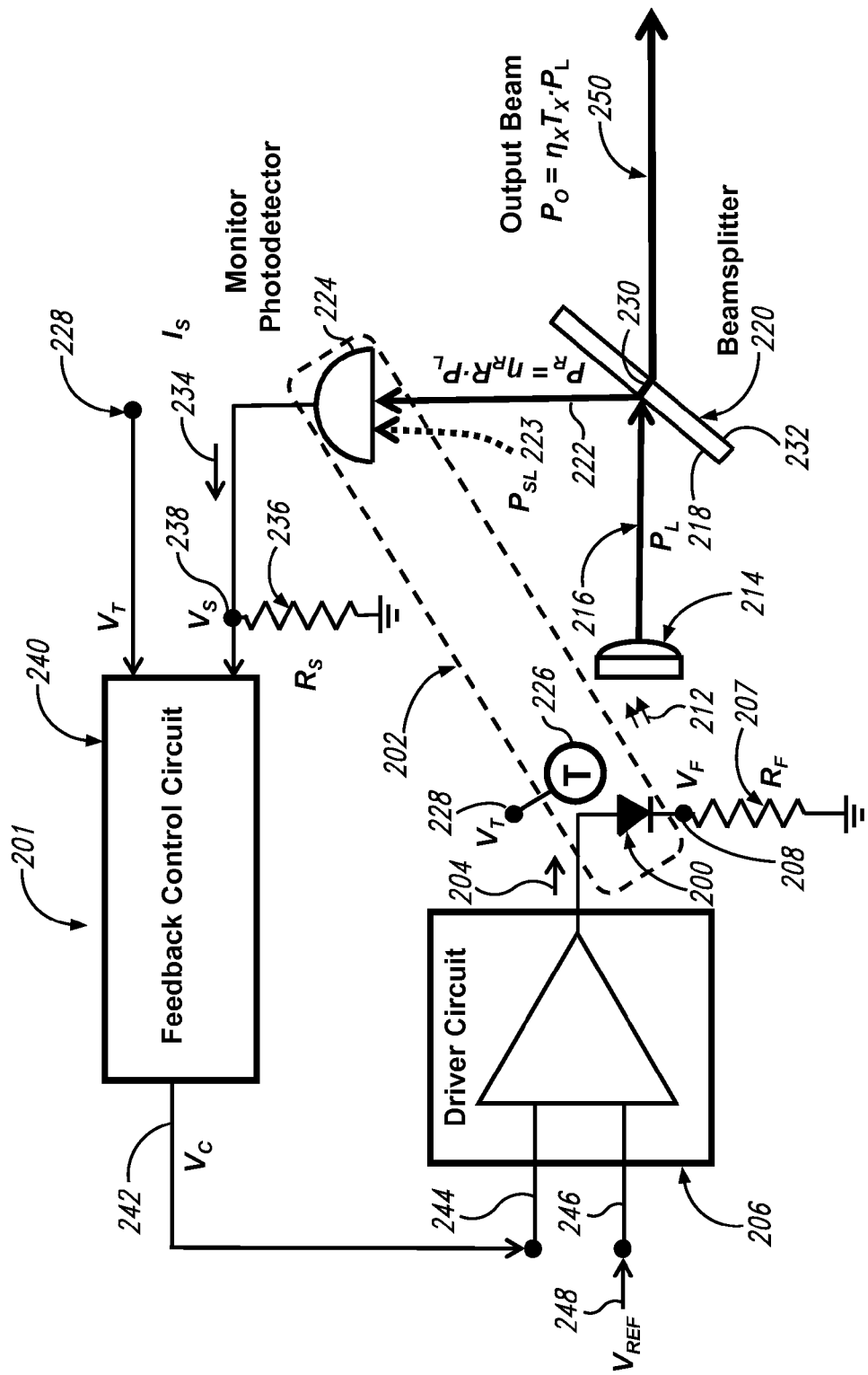
FIG. 2 is a functional block diagram of a closed-loop control apparatus for emitting light of controlled power formed in accordance with the present disclosure of an feedback control circuit in a feedback loop to produce a control voltage.

Exemplary Implementation:

An exemplary preferred implementation of a light-source system 201 with a closed-control loop is shown in FIG. 2. The system 201 achieves the benchmark stability without temperature stabilization and solving the manufacturing challenges presented by the method of U.S. Pat. No. 8,502,452. The novel features disclosed herein are the feedback control circuit introduced in the feedback loop of the light source depicted in FIG. 1 and the methods for continuously varying the feedback signal so as to virtually eliminate temperature effects and the control errors they produce. Those features are described in this section.

The first element is a semiconductor emitter 200 of incoherent light excited by a forward current or voltage 204 supplied by a driver circuit 206. A forward current flows through the semiconductor emitter and a resistor $R_F$ 207 to ground potential to produce signal $V_F$ 208, which represents the forward current in the light emitter as well as its junction temperature.

The semiconductor emitter 200 is bonded or otherwise mounted on a support pad or block of thermally conductive material 202. The thermally conductive material 202 is preferably comprised of material having thermal conductivity in excess of 220 W/m·°K. The semiconductor light emitter 200 and the photodetector 224 are mounted on the thermally conductive support material 202 to maintain them at substantially the same temperatures.

The emitted light 212 of power P is collimated by optic 214 to produce a light beam 216 of power $P_L$. The light rays comprising a collimated beam are substantially parallel to one another. The light beam 216 impinges on a first surface 218 of a beamsplitter 220 (an ordinary microscope slide) where a first portion 222 with an power $P_R$ is reflected onto a monitor photodetector 224. The photodetector 224 can be part of a photodetector circuit that includes a sampling resistor, such as a sense resistor $R_S$ 236 operative to produce a sample voltage $V_S = R_S \cdot I_S$ 238, as described more fully below.

The photodetector 224 is bonded to the thermally conductive material 202. A temperature sensor 226 operative to sense temperature is disposed in the thermally conductive material 202 to produce a signal $V_T$ 228 indicating the light-emitter and photodetector temperatures. Pre-aged matched thermistors are the preferred temperature sensor because they have sensitivities (the change in thermistor resistance per unit change in temperature) on the order 5% (5,000 ppm) per °C., are interchangeable within 0.2° C., have guaranteed drift rates less than 0.01% (100 ppm) per year, and are commercially available. Other sensors can be used as will be known to those of skill in this technology. In a variation of the temperature sensor, the signal $V_F$ can be used to represent the temperature of the thermally conductive material 202 provided the semiconductor light emitter has been operated for a sufficiently long period prior to assembly of the disclosed light-source system such that $V_F(T)$ remains substantially unchanged over the life of a light source.

In this disclosure, the word 'temperature' means the temperature of the semiconductor emitter 200 or the photodetector or the value of signal $V_T$ or the signal $V_F$, depending on the context, because one value can be uniquely determined from the other. A second portion of the light beam 230 is transmitted through the first surface 218 of the glass plate to a second surface 232 where a second portion of light is reflected to the monitor photodiode 224. A third portion of light 250 having optical power $P_O = \eta_X T_X \cdot P_L$ is transmitted through the beamsplitter and is the output beam of the light-source system. The photodetector 224 converts the combined intensities of the first and second reflected beams to a photocurrent $I_S$ 234 that flows through a resistor $R_S$ 236 to ground potential and produces a sample signal $V_S$ 238. The sample signal $V_S$ 238 represents a sample of the light beam power $P_L$, which can be a voltage or a current. The sample signal $V_S$ 238 and temperature signal $V_T$ 228 are input to a feedback control circuit 240, which outputs a control signal $V_C$ 242. The control signal $V_C$ 242 is one input 244 to a driver circuit 206, and a second input 246 to the driver circuit 206 is a reference signal $V_{REF}$ 248. The driver circuit 206 supplies more or less current 204 to drive the light emitter 200 as required to maintain constant output power $P_O$ 250. The components 220, 224, and 201 form a feedback loop wherein a sample of the output is returned to driver circuit 206 for control purposes.

Referring to FIG. 2, the reflected light beam 222 has power $P_R = \eta_R R \cdot P_L$ and is coupled onto the monitor photodetector 224 with efficiency $\eta_R$. The reflected light is converted to electrical current $I_S = S \cdot P_R$ 234 by the photodetector and passes through a sense resistor $R_S$ 236 to produce the sample voltage $V_S = R_S \cdot I_S$ 238. The sense resistor is illustrative and it will be appreciated that there is more than one way to generate electrical feedback in a control loop, as is known in the art.

There are many ways to configure the feedback control circuit 240 (FIG. 2) so as to compensate for the temperature sensitivity of a light-source system that are within the scope of the present implementation. As shown on FIG. 3A for example, the temperature signal $V_T$ 300 is input to the feedback control circuit 302 (240, FIG. 2) wherein analog-to-digital converter ADC 304 digitizes it and the microprocessor 306 computes a digital error value and converts it to an error signal $\delta V_{ERR}$ 308 with a digital-to-analog converter DAC 310. The sample signal $V_S$ 312 is input to the feedback control circuit 302 where it is connected to a summing junction 314 and added to an error signal 308 to generate a control signal 316, $V_C = V_S + \delta V_{ERR}$, which is connected to driver circuit input 244 (FIG. 2). The error signal 308 can have positive polarity so as to cause the emitted light power 212 (FIG. 2) to increase, or $\delta V_{ERR}$ can be negative so as to cause the light power 212 to decline and maintain a constant output power 250 (FIG. 2) $P_O$.

A second configuration of the feedback control circuit 302 is illustrated in FIG. 3B, wherein the sample signal 312 and temperature signal 300 are connected to the ADC 304 by a single-throw double-pole analog switch 318. The switch 318 is actuated by a microprocessor 306 with a digital control line 320 so as to alternately digitize the input signals $V_S$ and $V_T$. These signals are used by the microprocessor 306 to compute a value $H(V_T)$, or an error signal $\delta V_{ERR}$ 308 and a control signal 316 $V_C = H(V_T) \cdot V_S$ or $V_C = V_S + \delta V_{ERR}$ so as to increase or decrease the control signal $V_C$ and compensate for temperature sensitivity of the light source. The value $H(V_T)$ functions like the term FB in equation (2).

In yet another configuration of the feedback control circuit 302 shown on FIG. 3C, the sample signal $V_S$ 312 is connected to the ADC 304, and the temperature signal $V_T$ 300 is connected to a second ADC 322 such that they can be used simultaneously by the microprocessor 306 to compute a control signal value 316 $V_C = H(V_T) \cdot V_S$ or $V_C = V_S + \delta V_{ERR}$ so as to increase or decrease the control signal $V_C$ and compensate for temperature sensitivity of the light source. Configuration C operates faster than configuration B because the input signals to the feedback control circuit 302 are digitized simultaneously.

Other forms of the control signal $V_C$ and means for its generation are in keeping with the scope of the present disclosure to introduce a correction term in the feedback loop that compensates for the error-causing factors listed in Table 1.

In yet another configuration of the system 201, the sample signal $V_S$ is connected to driver circuit input 244, providing a closed feedback loop. As shown in FIG. 3D, a reference control circuit 318 comprises an ADC 304 and a DAC 310 connected to a microprocessor 306. The input to the reference control circuit is temperature signal $V_T$ and the output $V_{REF}$ 320 is connected to input 246 of driver circuit 206. The reference control circuit computes a reference signal value 320 $V_{REF} = H(V_T) \cdot V_T$ or $V_{REF} = V_T + \delta V_{ERR}$ that compensates for the temperature sensitivity of the light source.

In ideal systems, $H(V_T)$ and $\delta V_{ERR}(V_T)$ are monotonic analytical functions determined at the time of manufacture such that the control signal $V_C$ can be computed analytically for any temperature in the operating range from Tmin to Tmax. In real systems, however, $H(V_T)$ and $\delta V_{ERR}(V_T)$ will have complex monotonic shapes that are most accurately represented by a lookup table created and loaded into a nonvolatile memory in the microprocessor at the time of manufacture. The signal $V_C$ is then computed for operating temperatures by interpolation. The lookup table and analytical function can have either a positive ($V_C$ increases with temperature) or a negative ($V_C$ decreases with temperature) slope, however, they must be monotonic and time invariant.

Preferred Systems Components:

This following section describes how various components function in the disclosed light-source systems. There are many other components with equivalent function that one of ordinary skill in the art could select to achieve the desired functionality.

Semiconductor Emitters:

A semiconductor laser is the preferred emitter of coherent light. The laser must be polarization-locked and preferably is a single-mode device that has been burned in prior use to eliminate infant failures. A polarization-locked laser emits light having a polarization plane that remains in a substantially fixed position with respect to the device. And further, a single-mode laser is one that emits light having essentially one frequency and wavelength. In addition, the mean time before failure should exceed 70,000 hours, which in combination with burn-in, reduces the likelihood that the peak wavelength, threshold current, slope efficiency, and beam quality will vary over the useful life of a light-source system.

An incoherent source that emits radiation from an aperture into a confined cone such as RCLEDs, EELEDs, and SLDs is preferred because the radiation can be collimated with a single aspherical lens that is commercially available and inexpensive. The use of LEDs requires additional means to produce a collimated beam while substantially increasing the number of peak-wavelength and bandwidth options. The peak wavelengths of incoherent emitters range from 245 nm to 1,720 nm at the time of this disclosure and additional wavelengths continue to be introduced to the market.

Commercially available lasers and incoherent-light emitters having preferred attributes for the present disclosure are well known to those of ordinary skill in the art.

Figure 4A:
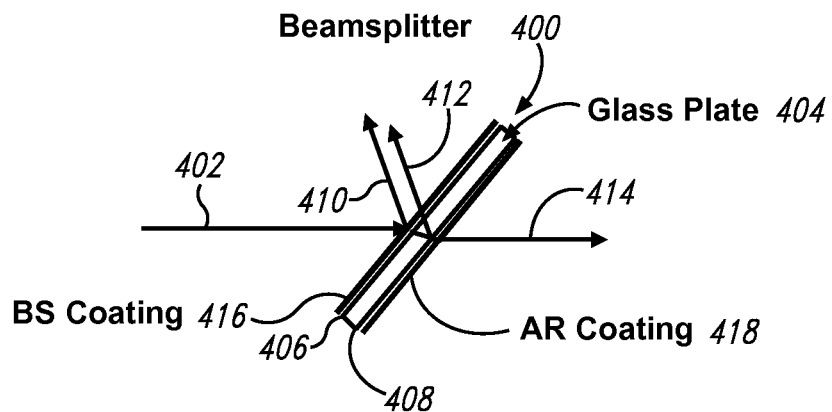
FIGS. 4A and 4B shows two variations of a beamsplitter for use with incoherent light emitters and lasers emitting coherent polarized light and the interference coatings that can be applied thereto.

Beamsplitters & Optical Coatings:

FIG. 4A illustrates a preferred configuration of the beamsplitter 220 from FIG. 2, denoted here as beamsplitter 400, for sampling a beam of incoherent light 402. The beamsplitter 400 is comprised of a thin (<1 mm) glass plate 404 with a first surface 406 and a second surface 408 that are substantially parallel. The light beam and a normal to the first surface 406 close at an incidence angle that is preferably 35±20°. The exact value of the angle of incidence is not critical. The glass material must be transparent in the emission band of the light emitter. A UV-grade fused silica is preferred for UV, VIS and NIR bands, while LaSF9 glass has high transmittance out to 2.5 μm in the mid IR. The total reflectance from the first 406 and second 408 surfaces is $2R_1 \cdot (1-R_1)^2$, where $R_1$ is the reflectance of the first and second surfaces. The monitor photodetector (224 on FIG. 2) captures reflections 410 and 412 and transmits the residual light power 414. The internal transmittances of the 1-mm glass plates comprised of optical materials appropriate for the disclosed implementation are less than 0.005 (0.5%) and can be ignored in the selection process.

Table 2 lists the reflectances of beamsplitters made from various optical materials in columns with R headings and transmittances are listed in columns with T headings. These values were calculated for an angle of incidence of 45°. Other materials have equivalent properties as is well known. High-index glass, LaSF9 for example is preferred when high reflectance and signal-to-noise ratios (SNR) are required.

| | Emission Band | | | | | | | |
|---|---|---|---|---|---|---|---|---|
| | UV (250 nm) | | VIS (650 nm) | | NIR (1000 nm) | | mid IR (2500 nm) | |
| Glass | R | T | R | T | R | T | R | T |
| UVFS | 0.093 | 0.907 | — | — | — | — | — | — |
| BK7 | — | — | 0.094 | 0.906 | 0.092 | 0.908 | — | — |
| LaSF9 | — | — | 0.162 | 0.838 | 0.158 | 0.842 | 0.154 | 0.846 |

In applications where a larger sample signal $V_S$ is desired to increase the signal-to-noise ratio (SNR), a reflective interference coating 416 can be applied to the first surface of the plate and an antireflection coating 418 can be applied to the second surface to increase the beamsplitter reflectance. These coatings are commercially available and are well known in the art. An increase in SNR is gained with concomitant loss of output optical power.

Figure 4B:
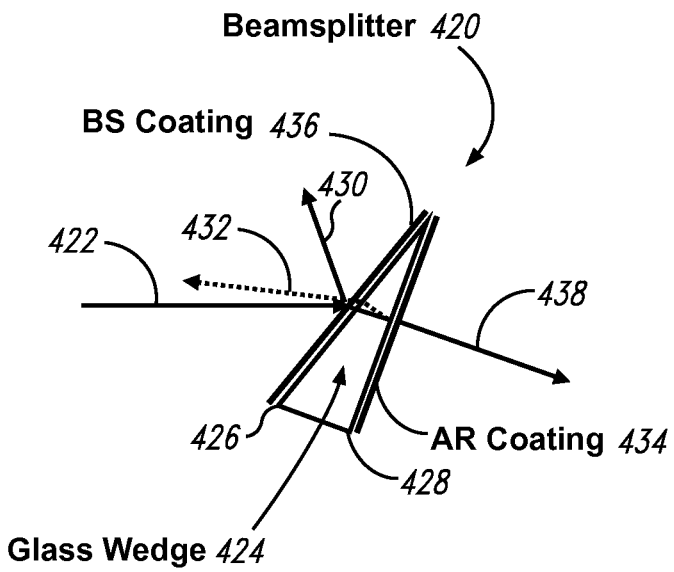

FIG. 4B illustrates a preferred configuration of a beamsplitter 420 for sampling a beam of coherent polarized light 422. The beamsplitter 420 is a wedge of glass 424 having a first surface 426 and a second surface 428 that meet at an acute angle of about 20±5°. The exact angle is not critical and is determined by the packaging requirements of the light source. The light beam 422 strikes the first surface 426 at an incidence angle that is preferably 35±20° and the reflected beam 430 is captured by the monitor photodetector 224 (FIG. 2), while the reflection from the second surface 432 is directed away from the optical path of the light source to prevent interference fringes. An antireflection coating 434 can be applied to the second surface to enhance the power of the transmitted light beam 438.

The reflectances of a wedge beamsplitter with a 45° incidence angle for the various emission bands and materials are approximately half of the values listed in Table 2. In order to increase the sample signal $V_S$ and the SNR, a reflective interference coating 436 can be applied to the first surface. The reflective coating 436 and antireflection coating 434 preferably have polarization ratios less than about 1.2. The polarization ratio is the reflectance of transverse-electric (TE) light polarization divided by the reflectance of the transverse magnetic (TM) polarized light.

Monitor Photodetectors:

Photodiodes are the preferred monitor photodetectors for the disclosed light-source system because they are commercially available for quantitative measurements of UV-, VIS-, and IR-light power and are configured in a wide variety of planar shapes and sizes ranging from 4 to 100 mm². In a light-source system comprising a laser, the photodiode must be windowless to prevent the formation of interference fringes in the light-sensitive area. Moreover they are inexpensive relative to other detector types. Silicon photodiodes optimized for the UV have responsivities S=0.1-0.15 A/W ones optimized for the VIS and NIR bands (400-1,000 nm) have responsivities S=0.2-0.7 A/W. InGaAs photodiodes are preferred for the mid-IR band (1,000-2,500 nm) and have S=0.5 to 1.1 A/W. Photodiode responsivities drift less than 0.5% per year and temperature coefficients (dS/dT) are in the range ±0.1% per °C. (silicon photodiodes) and ±0.25% per °C. (InGaAs photodiodes). Spatially uniform responsivity is a preferred attribute for the present disclosure. Spatially uniform, ultra-low (virtually zero) drift photodiodes are supplied by Teledyne Judson Technologies and Hamamatsu.

Calibration of the Light-Source System:

The temperature sensitivities of the components of a light source system assembled in the manner of a preferred implementation 201 (FIG. 2) will have tolerances that combine to give a unique net control error examples of which are provided in Table 1. No two light sources selected from a production lot will have identical net control errors. For this reason, all light sources in a production lot must be individually calibrated at time of manufacture to determine $H(V_T)$ or $\delta V_{ERR}(V_T)$ depending on the structure of the feedback control circuit.

The calibration process is accomplished with an apparatus 500 configured such as is illustrated in FIG. 5. In FIG. 5, wide arrows represent light beams, thin arrows represent electrical signals, and open arrows represent digital interfaces. The apparatus 500 includes a light source system 510 having a semiconductor light emitter 512 with an integral temperature sensor 514, a beamsplitter 516, a monitor photodetector 518 positioned to capture a sample light beam 520 of emitted light 522. The light source system 510 further includes a feedback control circuit 524 and a driver circuit 526.

The light source system 510 projects a beam of light 528 onto a light detector 530 wherein substantially all of the light power is converted to a digital signal 532 that is input to a microprocessor or computer 534. The light detector 530 can take one of many forms as is well known in the art. In the case when the light source system 510 produces coherent light, the light detector 530 is preferably a photodiode capable of measuring power at all laser wavelengths emitted in the operating temperature range. Alternatively, the detector is preferably a spectrometer capable of measuring the power of broadband emissions from incoherent emitters such as RCLEDs and SLDs. In either case, the photodetector is preferably calibrated to measure power in absolute units such as Watts to an accuracy of 10 ppm and the calibration is traceable to photometric standards maintained by the National Institute of Standards and Technology in the United States or an equivalent international organization.

The light source system 510 is coupled by a thermal coupler element 536 to a temperature controller 538 such that both are at substantially the same temperature. And further, the absolute temperature of the thermal coupler 536 is measured by a temperature sensor 540 to produce a digital temperature reading 542. The digital reading 542 is transmitted to the computer 534. The temperature controller 538 is coupled to the computer 534 by a digital interface 544. The calibration configuration thus depicted is automatic and does not require an operator interface. There are many ways to configure a means for calibrating a light source system and providing an operator interface (video display, pointing device, tablet, smart phone, etc.) as is well known in the art.

Subsequent to identification of the components to be used to manufacture the light source, the optimum method for determination of the control signal $V_C(V_T)$ at arbitrary temperatures in the operating range is selected. A first exemplary way this can be accomplished is to develop an analytical function $H(V_T)$ or $\delta V_{ERR}(V_T)$ such as a polynomial by regression analysis, as is well known in the art, and to store the function in the light-source memory. As temperature varies, the control unit continuously changes the value H or $\delta V_{ERR}$ used to calculate $V_C$. The first method is preferred when the coefficient of determination $r^2$ of the regression is equal to or exceeds 0.9999. Otherwise, a second exemplary method for determination of the control signal $V_C(V_T)$ interpolates the value $H(V_T)$ or $\delta V_{ERR}(V_T)$ from a lookup table developed with calibration data. The calibration process can be automated and done in batch mode with readily available off-the-shelf components.

Before the calibration process, the microprocessor (306 in FIGS. 3A-3D) is programmed to perform an iteration to determine either $H(V_T)$ or $\delta V_{ERR}(V_T)$ at each calibration temperature value and to record the value and $V_T$. The setup for a calibration run entails three steps: (1) the thermally conductive elements 202 (FIG. 2) of the light sources are bonded by temporary means to the thermal coupler 536; (2) placement of the photodetector 530 so as to capture substantially all of the output light beam 528; (3) the temperature controller 538 is set by the computer 534 to a reference temperature $T_0$ (either $T_{min}$ or $T_{max}$) and the temperature signal $V_T$ is allowed to stabilize; and (4) the power of the source(s) is set to a desired reference level $P_0$. The temperature controller 538 is preferably capable of controlling the temperature of the thermally conductive element 202 to an accuracy of 0.1° C. with a stability of ±0.01% per minute. The apparatus 538 is commercially available The calibration process is controlled by computer 534 to accomplish the following steps: (1) record the power of the light beam 528; this is the reference power $P_0$ in absolute units and signal the microprocessor to store the values $V_{T0}$ and $H(V_{T0})$ or $\delta V_{ERR}(V_{T0})$ in nonvolatile memory via interface 546; (2) set the temperature of the thermal coupler 536 to the next higher or lower calibration value; (3) allow the temperature signal to stabilize at the next value of $V_{T1}$; (4) signal the microprocessor to iterate the value $H(V_{T1})$ or the value $V_{ERR}(V_{T1})$ so as to obtain the reference power $P_0$±a preset tolerance appropriate for the desired calibration accuracy, preferably less than 25 ppm (note: numerical methods for the iteration are well known and software is commercially available for their implementation); (5) store the values $V_{T1}$ and $H(V_{T1})$ or $\delta V_{ERR}(V_{T1})$ in the nonvolatile memory; (6) repeat steps 2 through 5 for the remaining temperature steps $T_2, T_3, \ldots, T_N$, where $T_N$ is either $T_{min}$ or $T_{max}$; (7) sort the data in numeral order from $V_T(T_{MIN})$ to $V_T(T_{MAX})$ and develop a calibration data table; (8) perform regression analysis on the data table to determine an analytical function $H(V_T)$ or $\delta V_{ERR}(V_T)$; (9) if the coefficient of determination $r^2$ for the regression analysis is equal to or greater than 0.9999, load the function into the memory of the feedback control circuit 524 for operational determination of $V_C$; (10) if the coefficient of determination $r^2$ is less than 0.9999, sort the calibration data table in numerical order with respect to $V_T$ to create a lookup table and load it into memory. The criterion 0.9999 is arbitrary and can be established in accordance with the accuracy requirement of a particular application. The microprocessor of the feedback control circuit 524 uses the lookup table to determine $V_C$ by interpolation. There are other methods for determination of $V_C$ as is well known to those of ordinary skill. The preferred method (e.g. interpolation, numerical solution, etc.) is dictated by whichever method yields the lowest control error.

Figure 6:
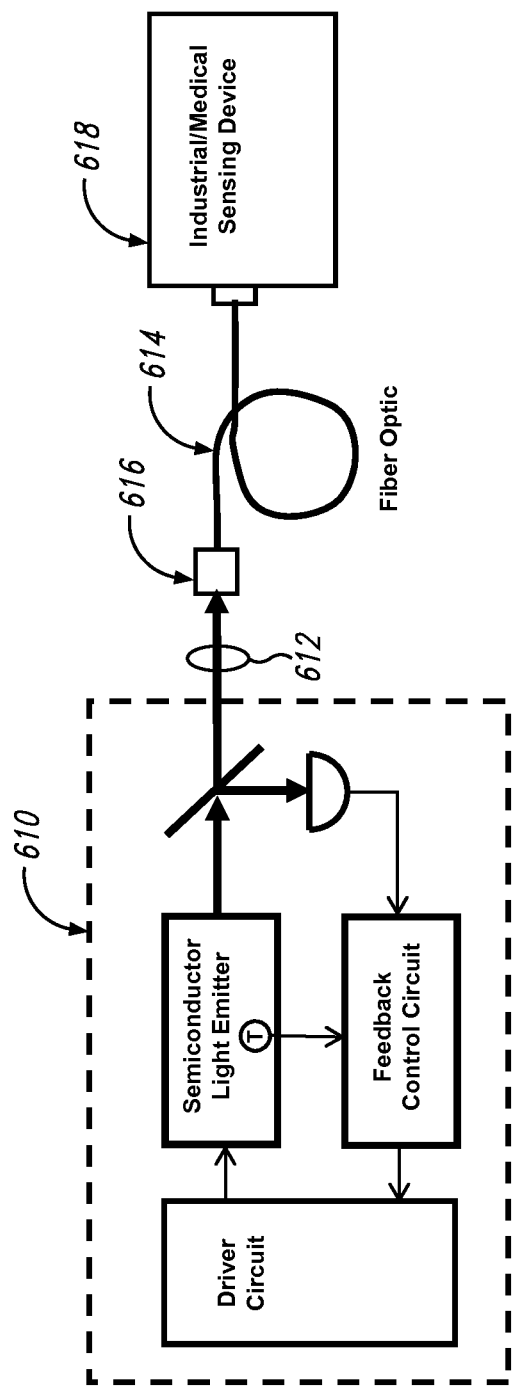
FIG. 6 illustrates a representative application of a stable light-source system coupled to an industrial/medical sensing device.

Exemplary Light-Source Systems:

FIG. 6 illustrates a system 610 comprising a temperature-stable light-source operationally configured in accordance with the disclosure that emits a light beam 612. In FIG. 6, wide arrows represent light beams and thin arrows represent electrical signals. The light beam 612 is coupled to an optical fiber 614 by coupler 616 so as to supply stable light power to an industrial or medical device 618. The device 618 might be a blood-gas monitor, water turbidity meter, a visibility detector, an optical gyroscope, or the like.

A system was assembled by the inventor that comprises a laser and beamsplitter wedge as depicted in FIG. 2 and exhibits temperature sensitivity. The feedback control circuit of the system is operatively configured as shown in FIG. 3A. The laser emits polarized coherent light, so the beamsplitter 220 comprises a glass wedge to prevent the formation of interference fringes in the optical system. Ideally, the reflectance of the first surface 216 is 0.044 and the beamsplitter transmittance is 0.912.

Figure 7:
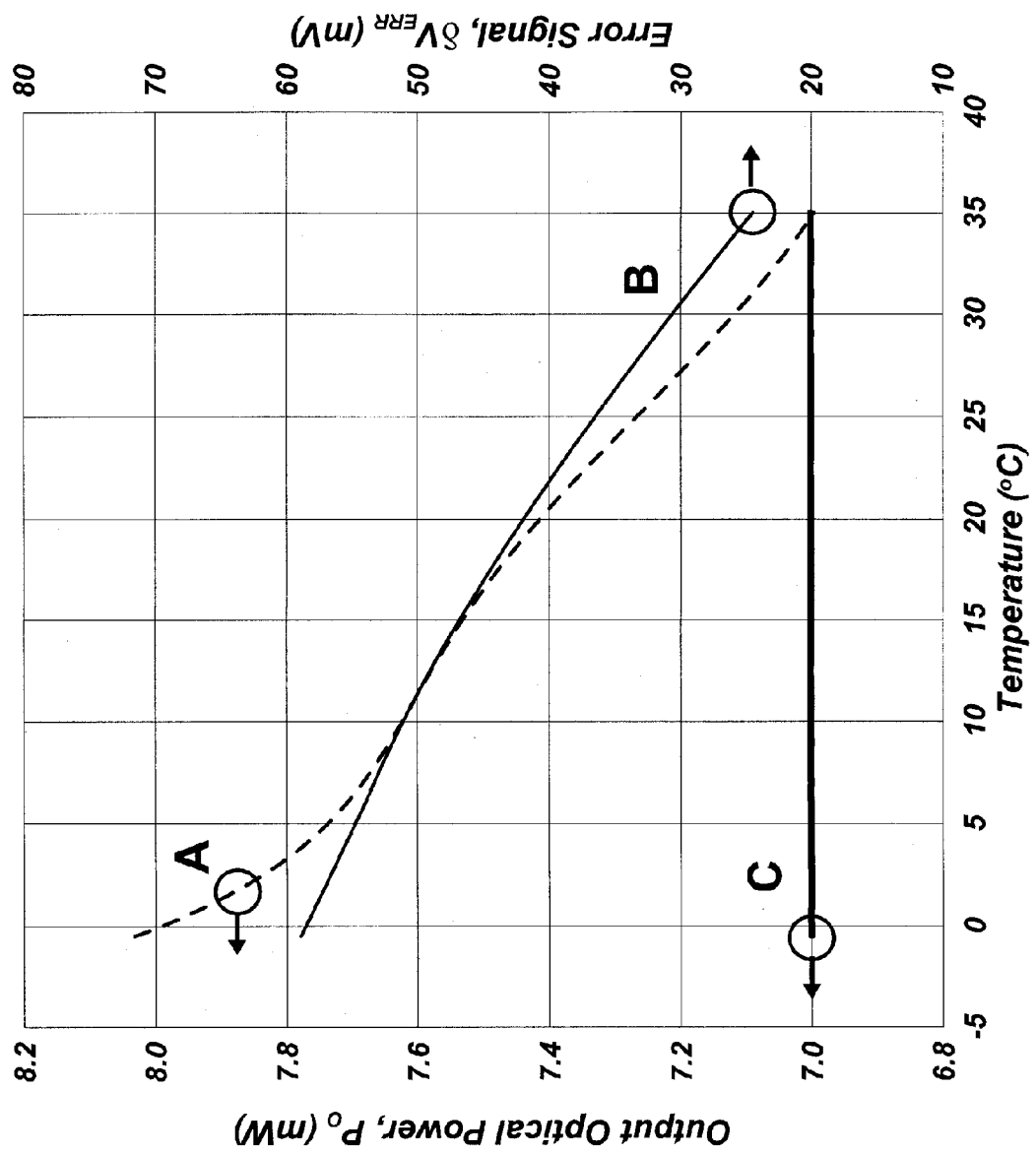
FIG. 7 shows plots of: (A) uncompensated output optical power; (B) the error signal $\delta V_{ERR}$; and (C) the compensated output light power for a light source configured within the scope of the present implementation, all as functions of calibration temperature.
Figure 8:
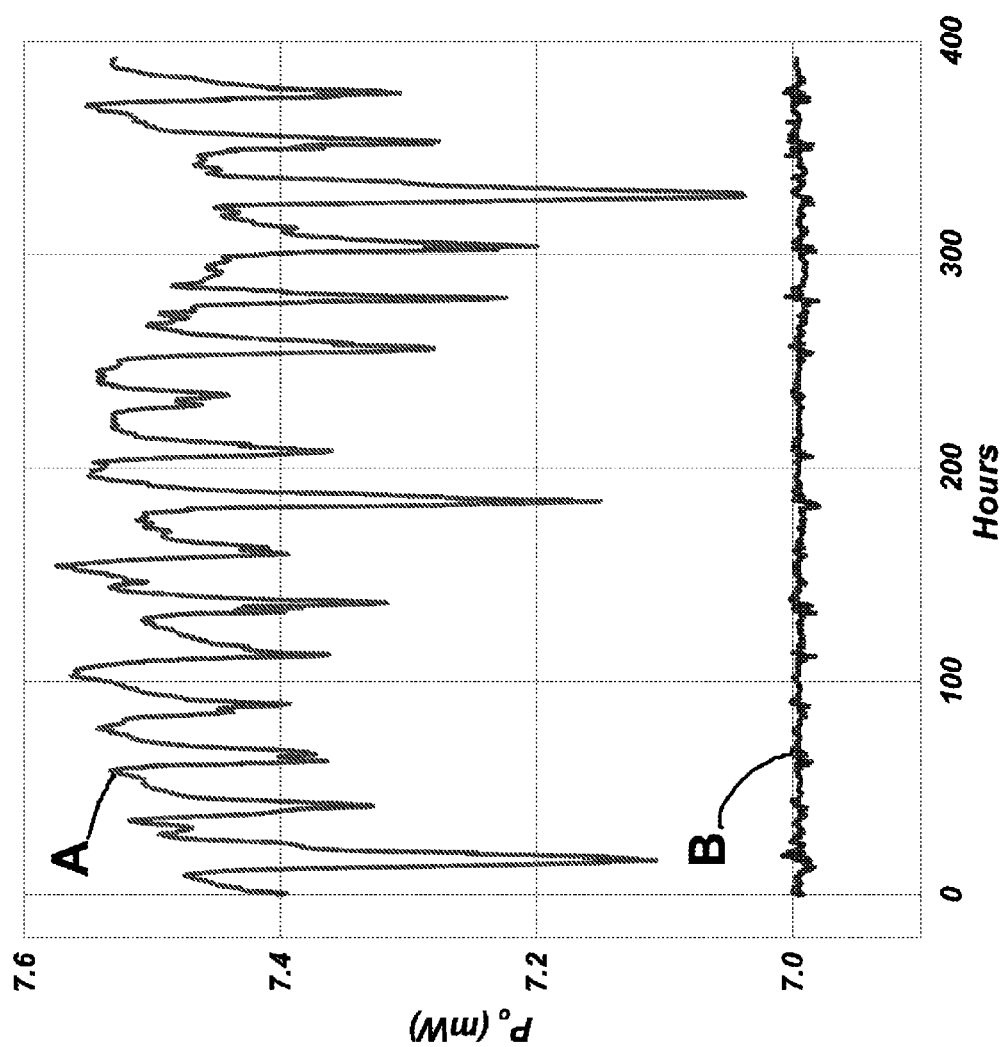
FIG. 8 shows plots of 400-hour time histories of uncompensated (A) and compensated (B) output optical power from a stable light source assembled according to the present implementation.

The uncompensated output optical power of the aforementioned laser-based system as a function of temperature is shown in FIG. 7 as a dashed-line curve 'A', with scale indicated by the left-hand vertical axis, and the error signal $\delta V_{ERR}(T)$ determined by the calibration procedure disclosed in a previous section is shown by the thin-line curve 'B', with scale given by the right-hand axis, and the compensated output optical power is shown by the bold solid-line curve 'C'. The calibrated system was operated for 400 hours in order to demonstrate that long-term stability of output optical power is obtained with the disclosed method. Histories of the uncompensated output optical power and the compensated output power are shown over the 400-hour test on FIG. 8 by the thin-line 'A' and bold line 'B', respectively. The disclosed compensation method results in a 30-fold reduction of the relative error ($\sigma/aveP_O$) for continuous operations.

The various implementations described above can be combined to provide further implementations. Aspects of the implementations can be modified, if necessary to employ concepts of the various patents, application and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A light source assembly, comprising:
a semiconductor light emitter structured to emit light, the semiconductor light emitter comprising one from a group containing resonant-cavity light-emitting diodes, single-mode, polarization-locked semiconductor lasers, and super luminescent diodes, wherein the light has a peak wavelength and bandwidth in bands in the group comprising ultraviolet-, visible-, and infrared-emission bands;
a driver circuit having a first input terminal, a second input terminal structured to receive a reference signal, and an output terminal, the driver circuit operative to supply a drive signal on the output terminal to excite light emissions from the semiconductor light emitter;
a lens operative to receive the light and to collimate the light into substantially parallel light rays;
a beamsplitter comprising a plate of optically transparent material having a first surface and a second surface, the beamsplitter positioned to capture and reflect a first portion of the light rays and transmit a remaining unreflected second portion of the light rays having a light power;
a photodetector circuit having a photodetector operative to capture substantially the entire reflected first portion of the light rays in the active area and to convert the captured light rays to a sample signal;
a thermally conductive support member that mounts the semiconductor light emitter and the photodetector to maintain them at substantially the same temperatures;
a temperature sensor coupled to the thermally conductive support member and operative to produce a temperature signal representative of the temperature of the semiconductor light emitter and the photodetector; and
a feedback control circuit having a first input terminal coupled to the temperature sensor, a second input terminal coupled to the photodetector circuit, and an output terminal coupled to the first terminal of the driver circuit, the feedback control circuit forming a feedback loop between the photodetector circuit and the first input terminal of the driver circuit and operative to provide a control signal on the output terminal to the first input terminal of the driver circuit and control the light power of the second portion of the light rays over an operative temperature range.

2. The light source assembly of claim 1, wherein the driver circuit is operative to maintain the control signal substantially equal to the reference signal.

3. The light source assembly of claim 2, wherein the driver circuit is structured to adjust the drive signal to excite more or less light emission by the semiconductor light emitter to maintain the light power of the second portion of the light rays substantially constant over an operating temperature range defined by $T_{min}$ and $T_{max}$.

4. The light source assembly of claim 2, wherein the feedback control circuit is operative to compute a correction factor responsive to the temperature signal to compensate for a net temperature error and to generate the control signal in proportion to the temperature signal.

5. The light source assembly of claim 4 wherein the feedback control circuit has an analog-to-digital converter coupled to the first input terminal of the feedback control circuit, a microprocessor coupled to the analog-to-digital converter, a nonvolatile memory coupled to the microprocessor, and a digital-to-analog converter coupled to the microprocessor and to the output terminal of the feedback control circuit.

6. The light source assembly of claim 4, wherein the feedback control circuit has a second input terminal, first and second analog-to-digital converters in which each analog-to-digital converter is coupled to a respective input terminal of the feedback control circuit, a microprocessor having two input terminals and an output terminal, each input terminal of the microprocessor coupled to a respective one of the analog-to-digital converters, a nonvolatile memory coupled to the microprocessor, and a digital-to-analog converter coupled between the output terminal of the microprocessor and to the output terminal of the feedback control circuit, the first and second analog-to-digital converters operative to provide simultaneous digitization of the respective temperature and sample signals received on the first and second input terminals of the feedback control circuit.

7. The light source assembly of claim 3, wherein the feedback control circuit is operative to compute a correction factor in response to the temperature signal and to apply the correction factor to the sample signal to compensate for control errors.

8. The light source assembly of claim 2, wherein the beamsplitter includes a plate of optically transparent material having interference coatings disposed on first and second surfaces to increase reflectance of the beamsplitter and signal-to-noise ratio of the light power of the second portion of the light rays and increase the light power of the second portion of the light rays.

9. The light source assembly of claim 1, wherein the semiconductor light emitter comprises a semiconductor, polarization-locked, single-mode laser operative to emit a beam of coherent polarized light.

10. The light source assembly of claim 9, wherein the beamsplitter comprises a glass-wedge beamsplitter having first and second surfaces that meet at an acute angle and having a polarization ratio less than about 1.2.

11. The light source assembly of claim 10, wherein the driver circuit is operative to maintain the control signal substantially equal to the reference signal.

12. The light source assembly of claim 10, wherein the driver circuit is operative to excite the laser to emit more or less light so as to maintain the light power of the second portion of light rays substantially constant over an operating temperature range defined by $T_{min}$ and $T_{max}$.

13. The light source assembly of claim 1 comprising a reference control circuit having an input operative to receive the temperature signal and to output the reference signal to the second input terminal of the driver circuit in response to the temperature signal.

14. A method for calibrating a feedback control circuit and the reference control circuit in a light source assembly, the method comprising:
   determining from component test data whether interpolation or numerical solution of a function will be used to minimize a net control error in operation of the light source;
   providing a characterization of a variation in peak wavelength with temperature in the light source and forward current through a semiconductor light emitter within a production lot;
   providing a computer programmed to control the calibrating of the feedback control circuit and the reference control circuit, including providing a temperature signal and a correction factor;
   providing a program enabling a microprocessor in the feedback control circuit to digitize and store a calibration temperature signal and a correction factor;
   providing a program enabling the microprocessor in the feedback control circuit to do a numerical iteration to determine an optimal correction factor for each calibration temperature;
   providing a means for temporarily bonding a thermally conductive support member to a temperature control apparatus capable of controlling the temperature of the thermally conductive member;
   providing a NIST-traceable photodetector or spectrophotometer for monitoring output light power of the light source in absolute units;
   setting the temperature control apparatus to a reference temperature, either $T_{min}$ or $T_{max}$, and allowing the temperature signal to stabilize;
   setting the output light power of the light source to an absolute reference level $P_0$;
   recording the absolute reference level $P_0$ in the computer;
   signaling the microprocessor to store a first calibration temperature and the corresponding correction factor;
   setting the temperature-control apparatus to the next calibration temperature and allowing the temperature signal to stabilize;
   signaling the microprocessor to determine by numerical iteration the value of the correction factor that minimizes a difference between the output optical power and the absolute reference level $P_0$;
   recording the temperature signal and the correction factor in memory; and
   setting the temperature-control apparatus to the next calibration temperature and allowing the temperature signal to stabilize.

15. The method of claim 14, comprising repeating the last four steps until the operating temperature range has been calibrated;
   sorting calibration data in a table of ascending or descending numerical order, the calibration data comprising temperature signals and corresponding correction factors representing an operating temperature range;
   performing a regression analysis to develop a function for determining the correction factor from an arbitrary value of the temperature signal; and
   programming the function in the microprocessor to perform operational calculations, and programming the table of temperature signals and corresponding correction factors in the microprocessor as a basis for interpolating correction factors from arbitrary temperature values representing the operating temperature range.

16. A system, comprising:
   a support formed of thermally conductive material;
   a semiconductor light emitter mounted on the support;
   a driver circuit operative to generate a driver signal to the semiconductor light emitter and to receive a reference signal;
   a device structured to receive the light and to reflect a first portion of the light and to output a second portion of the light;
   a photodetector circuit mounted on the support and operative to receive the first portion of the light and generate a sample signal in response to reception of the first portion of light;
   a temperature sensor disposed on the support and operative to generate a temperature signal; and
   a feedback control circuit operative to receive the temperature signal and the sample signal and in response thereto to generate a control signal to the driver circuit to maintain a light power of the second portion of light rays substantially constant over an operative temperature range defined by $T_{min}$ and $T_{max}$ the feedback control circuit having a microprocessor and a switch, the switch operative to receive the sample signal and the temperature signal and to alternately control digitization of the sample signal and the temperature signal, the microprocessor operative to use the digitized sample signal and temperature signal and generate the control signal to increase or decrease the control signal and reduce control errors resulting from temperature sensitivity of the light source.

17. The system of claim 16, further comprising a lens operative to receive the light from the semiconductor light emitter and collimate the light prior to reception by the device structured to reflect the first portion of the light.

18. The system of claim 17, wherein the feedback control circuit comprises a microprocessor operative to generate an error signal that is added to the sample signal to form the control signal.

19. The system of claim 17, wherein the feedback control circuit comprises a microprocessor having first and second inputs, and first and second analog-to-digital converters in which the first analog-to-digital converter is coupled to the first input of the microprocessor and the second analog-to-digital converter is coupled to the second input of the microprocessor, the first analog-to-digital converter operative to receive the sample signal, the second analog-to-digital converter operative to receive the temperature signal, the first and second analog-to-digital converters operative to digitize the sample signal and the temperature signal simultaneously, the microprocessor operative to simultaneously use the sample signal and the temperature signal to generate the control signal and increase or decrease the control signal to compensate for temperature sensitivity of the source.

* * * * *